United States Patent
Kawabata et al.

(10) Patent No.: US 10,739,311 B2
(45) Date of Patent: Aug. 11, 2020

(54) RAIL INSPECTION SYSTEM

(71) Applicant: HITACHI HIGH-TECH FINE SYSTEMS CORPORATION, Saitama (JP)

(72) Inventors: Ryuzo Kawabata, Tokyo (JP); Akihiko Kandori, Tokyo (JP)

(73) Assignee: HITACHI HIGH-TECH FINE SYSTEMS CORPORATION, Saitama (JP)

( * ) Notice: Subject to any disclaimer, the term of this patent is extended or adjusted under 35 U.S.C. 154(b) by 0 days.

(21) Appl. No.: 16/313,729

(22) PCT Filed: Jun. 9, 2017

(86) PCT No.: PCT/JP2017/021429
§ 371 (c)(1),
(2) Date: Dec. 27, 2018

(87) PCT Pub. No.: WO2018/003460
PCT Pub. Date: Jan. 4, 2018

(65) Prior Publication Data
US 2019/0170692 A1    Jun. 6, 2019

(30) Foreign Application Priority Data
Jun. 9, 2017 (JP) .................... 2016-127400

(51) Int. Cl.
*G01N 27/00* (2006.01)
*G01N 27/72* (2006.01)
(Continued)

(52) U.S. Cl.
CPC .............. *G01N 27/72* (2013.01); *B61K 9/08* (2013.01); *G01R 33/12* (2013.01); *G01N 2291/0234* (2013.01); *G01N 2291/2623* (2013.01)

(58) Field of Classification Search
CPC .............................................. G01N 2291/2623
(Continued)

(56) References Cited

U.S. PATENT DOCUMENTS

| 4,943,772 A | 7/1990 | Maupu et al. |
| 5,270,886 A * | 12/1993 | Nigam ................. G11B 5/5552 360/77.03 |

(Continued)

FOREIGN PATENT DOCUMENTS

| CN | 104006731 A | 8/2014 |
| JP | S57-173701 | 10/1982 |

(Continued)

OTHER PUBLICATIONS

International Search Report for PCT/JP2017/021429, dated Sep. 5, 2017.
(Continued)

*Primary Examiner* — Max H Noori
(74) *Attorney, Agent, or Firm* — Volpe and Koenig, P.C.

(57) ABSTRACT

In a rail inspection system, a positional deviation can be detected with accuracy. The rail inspection system includes a first sensor unit which is disposed to face a rail for a vehicle, and includes at least one receiver coil and at least one oscillation coil which are arranged in an arrangement direction intersecting with a layout direction of the rail, an AC voltage source which applies AC voltage to the oscillation coil, and a displacement detection unit which detects a displacement between the rail and the first sensor unit based on an induced voltage of the receiver coil. The first sensor unit is configured such that, when the displacement is a first displacement, a first maximum value appears in the induced voltage, and when the displacement is a second
(Continued)

displacement, a second maximum value of which a phase is reversed against the first maximum value appears in the induced voltage.

4 Claims, 9 Drawing Sheets

(51) Int. Cl.
*B61K 9/08* (2006.01)
*G01R 33/12* (2006.01)

(58) Field of Classification Search
USPC .................................................. 73/770
See application file for complete search history.

(56) References Cited

U.S. PATENT DOCUMENTS

| | | | | |
|---|---|---|---|---|
| 5,825,177 | A * | 10/1998 | Finnestad | B60L 3/10 |
| | | | | 324/179 |
| 6,064,315 | A * | 5/2000 | Orlassino | B61L 1/165 |
| | | | | 246/249 |
| 6,371,417 | B1 * | 4/2002 | Southon | B61L 1/165 |
| | | | | 246/247 |
| 2005/0285588 | A1 | 12/2005 | Katragadda et al. | |
| 2012/0137761 | A1 | 6/2012 | Dardelin et al. | |
| 2018/0172639 | A1 * | 6/2018 | Kawabata | G01N 27/83 |

FOREIGN PATENT DOCUMENTS

| | | |
|---|---|---|
| JP | S58-21504 A | 2/1983 |
| JP | H10-122806 A | 5/1998 |
| JP | H10-332308 A | 12/1998 |
| JP | 2003-270214 A | 9/2003 |
| JP | 2007-132923 A | 5/2007 |
| JP | 2012-514207 A | 6/2012 |
| JP | 2013-246042 A | 9/2013 |
| JP | 2014-81303 A | 5/2014 |
| JP | 2017-88411 A | 5/2017 |
| WO | 2017/006589 A1 | 1/2017 |

OTHER PUBLICATIONS

Extended European Search Report dated Jan. 14, 2020 for the European Patent Application No. 17819825.5.

* cited by examiner

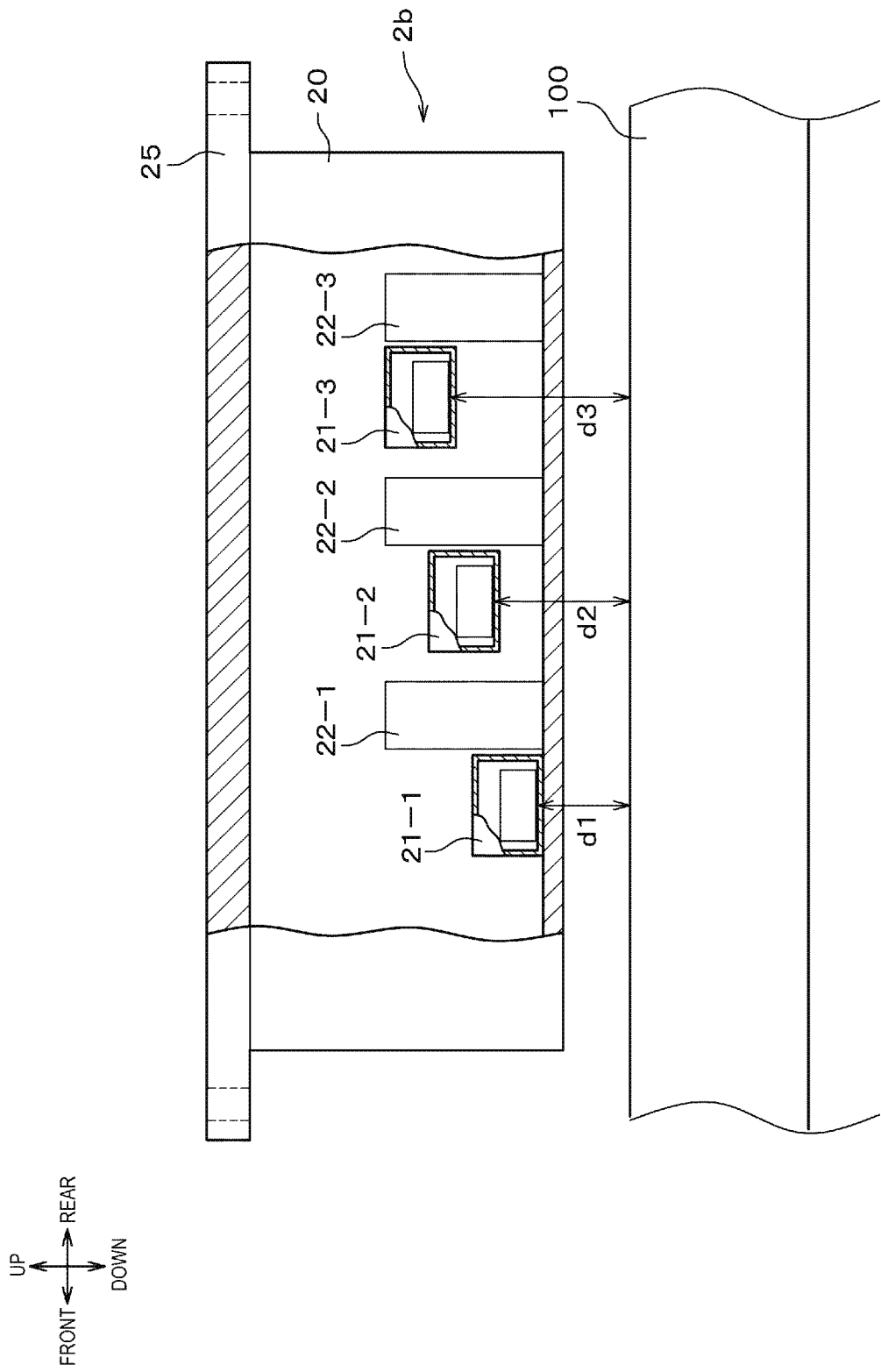

RAIL INSPECTION SYSTEM

BACKGROUND OF THE INVENTION

1. Field of the Invention

The present invention relates to a rail inspection system.

2. Description of Related Art

A rail used in a railroad and the like is deformed as a vehicle runs, and a positional deviation of the rail is caused. When the positional deviation of the rail is unattended, a vehicle derailment may occur. Therefore, there is proposed a technique for providing an apparatus which detects the positional deviation of the rail in an inspection vehicle (a railway vehicle for inspecting a state of a route and an overhead wire).

For example, in Paragraph 0021 of JP-A-2013-246042, there is described "Therefore, in a rail position detection unit 11 according to the embodiment (that is, a two-dimensional laser displacement meter), as illustrated in FIG. 3(a), a distance from the rail position detection unit 11 to a rail R, and a distance from the rail position detection unit 11 to a vehicle wheel 7 are measured at the same time to detect a position (hereinafter, simply referred to as "position of the rail") in a vehicle axial direction of the rail with respect to the vehicle wheel 7".

In addition, in Abstract of US-A-2005-0285588, there is described "According to an embodiment, the present technique is to provide a test device for testing perfectness of a material in a test target. The test device includes an electrical conductor and a detection device. In a typical inspection device, the electrical conductor generally extends in a linear direction, and a current generally flows in a direction traversing a longitudinal axis of the test target. The path of the current flowing in the electrical conductor affects a magnetic field around the test target, and generates an overcurrent indirectly. In addition, the test device includes a detection device which is disposed at a position away from the electrical conductor, and detects a magnetic field generated according to the current flowing through the electrical conductor."

However, in the technique of JP-A-2013-246042, if foreign matters such as snow, ice, weeds, and fallen leaves are attached to a rail, a laser beam is reflected on these foreign matters, and thus a position of the rail is erroneously detected.

In addition, in the technique of US-A-2005-0285588, a magnetic field generated by an overcurrent is detected. However, a magnitude of the overcurrent is reversely proportional to a square of a distance between a test device and a test target (rail). Therefore, an error generated by vibration of an inspection vehicle becomes large, and a positional deviation of the rail is hardly detected with accuracy.

SUMMARY OF THE INVENTION

The invention has been made in view of the problems, and an object thereof is to provide a rail inspection system which can detect the positional deviation of the rail with accuracy.

In order to solve the problems, a rail inspection system of the invention includes a first sensor unit which is disposed to face a rail for a vehicle, and includes at least one receiver coil and at least one oscillation coil which are arranged in an arrangement direction intersecting with a layout direction of the rail, an AC voltage source which applies an AC voltage to the oscillation coil, and a displacement detection unit which detects a displacement between the rail and the first sensor unit based on an induced voltage of the receiver coil. The first sensor unit is configured such that, when the displacement is a first displacement, a first maximum value appears in the induced voltage, and when the displacement is a second displacement, a second maximum value of which a phase is reversed against the first maximum value appears in the induced voltage.

According to the rail inspection system of the invention, it is possible to detect a positional deviation of a rail with accuracy.

BRIEF DESCRIPTION OF THE DRAWINGS

FIG. 8 is a side view partially broken away illustrating a detection device in a third embodiment.

DESCRIPTION OF EMBODIMENTS

First Embodiment

<Exterior Configuration of First Embodiment>

Figure 1:
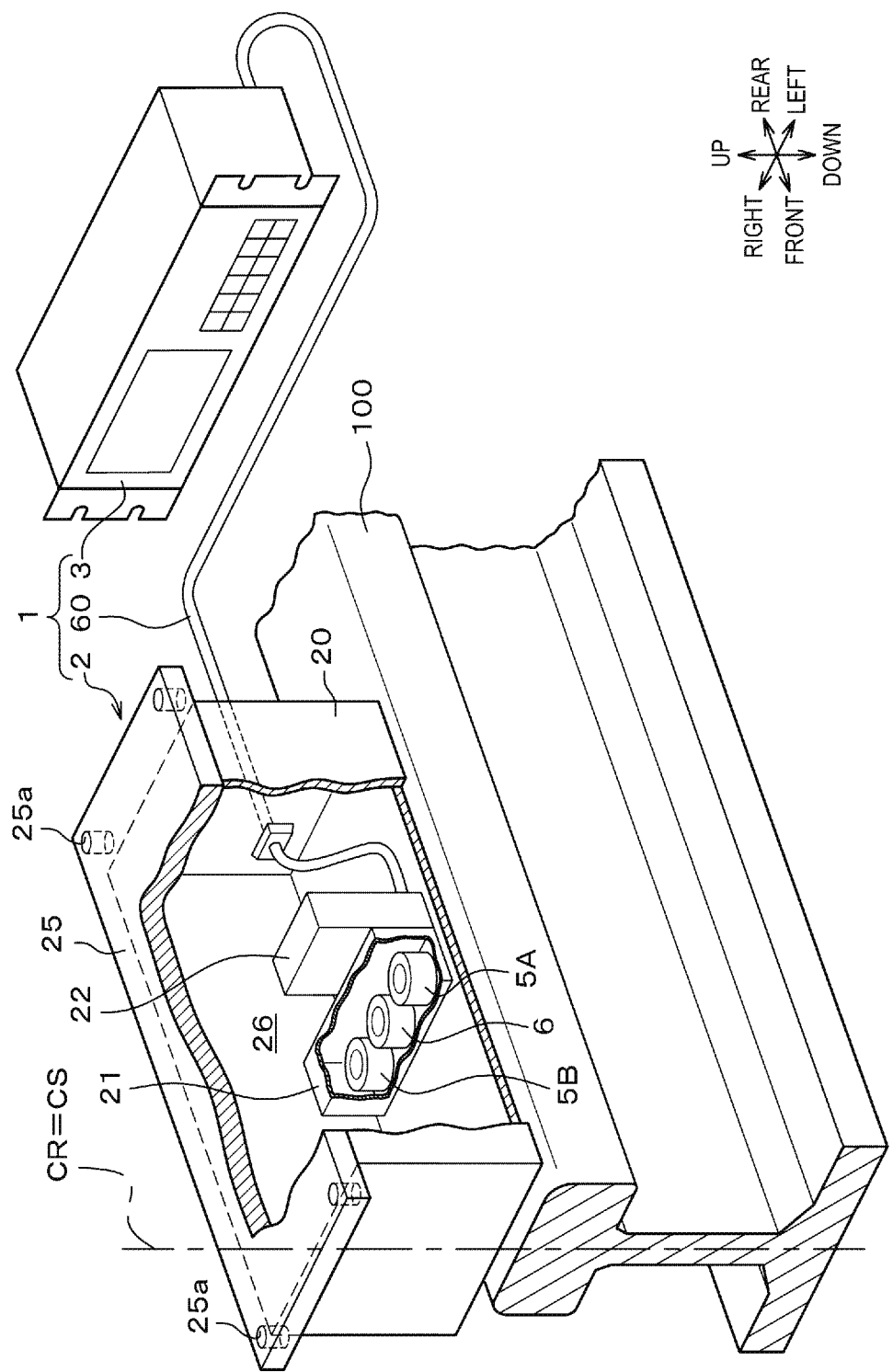
FIG. 1 is a perspective view partially broken away illustrating a rail inspection system according to a first embodiment of the invention.

FIG. 1 is a perspective view partially broken away of a rail inspection system 1 in a first embodiment of the invention.

The rail inspection system 1 in FIG. 1 includes a detection device 2, a processing device 3, and a cable 60 which connects the detection device 2 and the processing device 3. The rail inspection system 1 is mounted in an inspection vehicle (not illustrated). The detection device 2 is provided at a position facing a railroad rail 100 (rail) which is an inspection target. The processing device 3 is provided in a cabin of the inspection vehicle. Herein, a layout direction of the railroad rail 100 is set to a "front and rear direction", a direction horizontally perpendicular to the layout direction is set to a "left and right direction", and a direction vertically perpendicular to the layout direction is set to an "upper and lower direction".

The detection device 2 includes a chassis 20 which is formed in a hollow cuboid shape, and a rectangular flange 25 (attaching tool) which is fixed to the upper surface of the chassis 20. Through holes 25a are formed at four corners of the flange 25. In addition, screw holes are formed at positions facing these through holes 25a in a dolly (not illustrated) of the inspection vehicle. Bolts (not illustrated) pass through the through holes 25a and the screw holes, and are fastened, so that the detection device 2 is fixed at a predetermined position of the dolly. When the railroad rail 100 is laid at a predetermined reference position, and the detection device 2 is fixed to the predetermined position, a center line CR of the railroad rail 100 and a center line CS of the detection device 2 coincide as in the drawing. Therefore, the flange 25 serves as a tool to adjust the center line CR of the detection device 2 to a predetermined position.

The chassis 20 is a non-magnetic material such as glass epoxy. In the bottom surface of the chassis 20, a sensor unit 21 (first sensor unit) of a substantially cuboid shape and an amplification/filter unit 22 are fixed. In the center in the sensor unit 21, a receiver coil 6 (first receiver coil) cylindrically winding a coated wire is disposed, and an oscillation coil 5A (first oscillation coil) and an oscillation coil 5B (second oscillation coil) formed similarly to the receiver coil 6 are disposed at an equal interval in the left and right direction of the receiver coil 6. In the oscillation coils 5A and 5B, AC voltage of a predetermined oscillation frequency f is applied from the processing device 3 through the cable 60. Thus, the oscillation coils 5A and 5B generate AC magnetic fields peripherally. In addition, an induced voltage is generated in the receiver coil 6 in proportion to a differentiated value of an interlinking magnetic flux.

The amplification/filter unit 22 amplifies the induced voltage of the receiver coil 6, and performs filtering, and supplies the result to the processing device 3. The processing device 3 detects a magnitude of a positional deviation of the railroad rail 100 based on the supplied detection signal. Herein, the positional deviation is a value corresponding to a displacement L (see FIG. 2B) of the center line CR of the railroad rail 100 and the center line CS of the detection device 2. An inner space 26 of the chassis 20 is filled with resin (not illustrated). With this configuration, even when vibration and impact are added to the detection device 2, deviation is not caused in the sensor unit 21 and the like.

<Principle of Position Detection>

Next, a principle of the position detection in this embodiment will be described with reference to FIGS. 2A and 2B.

Figure 2A:
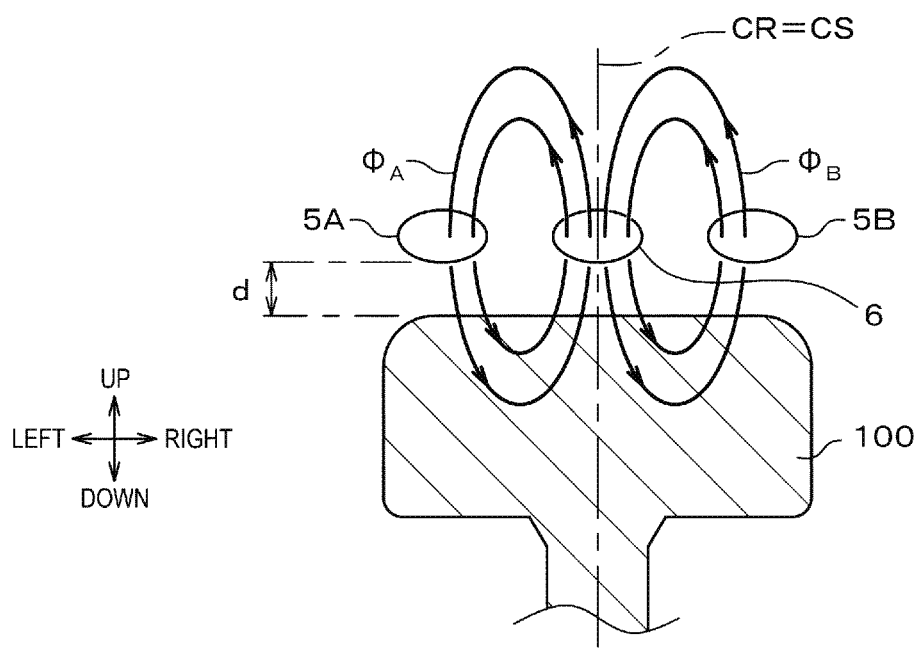
FIG. 2A is a diagram illustrating a positional relation between a railroad rail, an oscillation coil, and a receiver coil.

FIG. 2A illustrates a layout of the oscillation coils 5A and 5B and the receiver coil 6 when the center line CR of the railroad rail 100 and the center line CS of the detection device 2 (see FIG. 1) are matched.

As illustrated in the drawing, the center line CS of the detection device 2 is also a center line of the receiver coil 6. A distance in the upper and lower direction between the oscillation coils 5A and 5B and the receiver coil 6 and the railroad rail 100 is called a sensor gap d (distance). AC voltage having a reverse phase is applied to the oscillation coils 5A and 5B to generate reverse magnetic fields from the oscillation coils 5A and 5B. More specifically, the oscillation coils 5A and 5B are connected in series, and the AC voltage may be applied to the series circuit.

Magnetic fluxes ΦA and ΦB respectively generated by the oscillation coils 5A and 5B are propagated through the railroad rail 100 and the air. Both magnetic fields cancel each other in the receiver coil 6, the interlinking magnetic flux in the receiver coil 6 becomes almost zero, and the induced voltage of the receiver coil 6 also becomes almost zero.

Figure 2B:
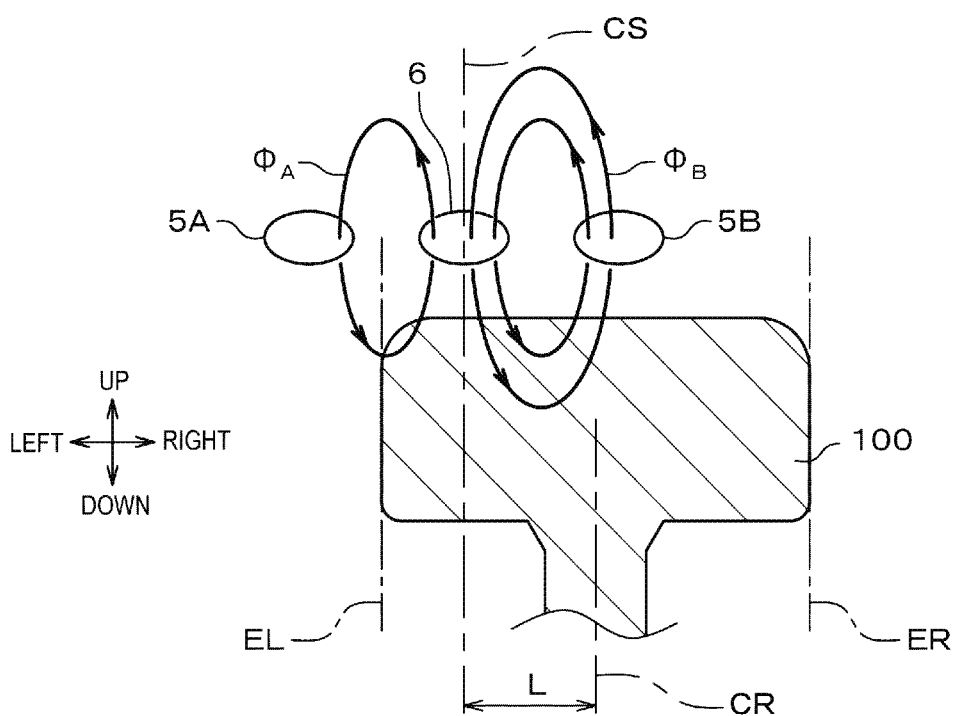
FIG. 2B is a diagram illustrating another positional relation between the railroad rail, the oscillation coil, and the receiver coil.

In addition, FIG. 2B illustrates a layout of the oscillation coils 5A and 5B and the receiver coil 6 when the center line CR of the railroad rail 100 and the center line CS of the detection device 2 (see FIG. 1) are not matched.

The magnetic field generated by the oscillation coil 5A is propagated through the air with low magnetic permeability in a longer distance than the railroad rail 100 with high magnetic permeability. Therefore, the magnetic flux ΦB (amplitude) generated by the oscillation coil 5B becomes relatively stronger than that magnetic flux ΦA (amplitude) generated by the oscillation coil 5A. In the receiver coil 6, a non-zero interlinking magnetic flux is generated, and a non-zero induced voltage is generated. Therefore, the induced voltage is measured and output as the detection signal, so that the displacement L between the center line CR of the railroad rail 100 and the center line CS of the detection device 2 can be measured. When a left edge position EL of the railroad rail 100 is located between the oscillation coil 5A and the receiver coil 6 (the illustrated state), or a right edge position ER of the railroad rail 100 is located between the oscillation coil 5B and the receiver coil 6, a peak amplitude of the detection signal appears.

Figure 3:
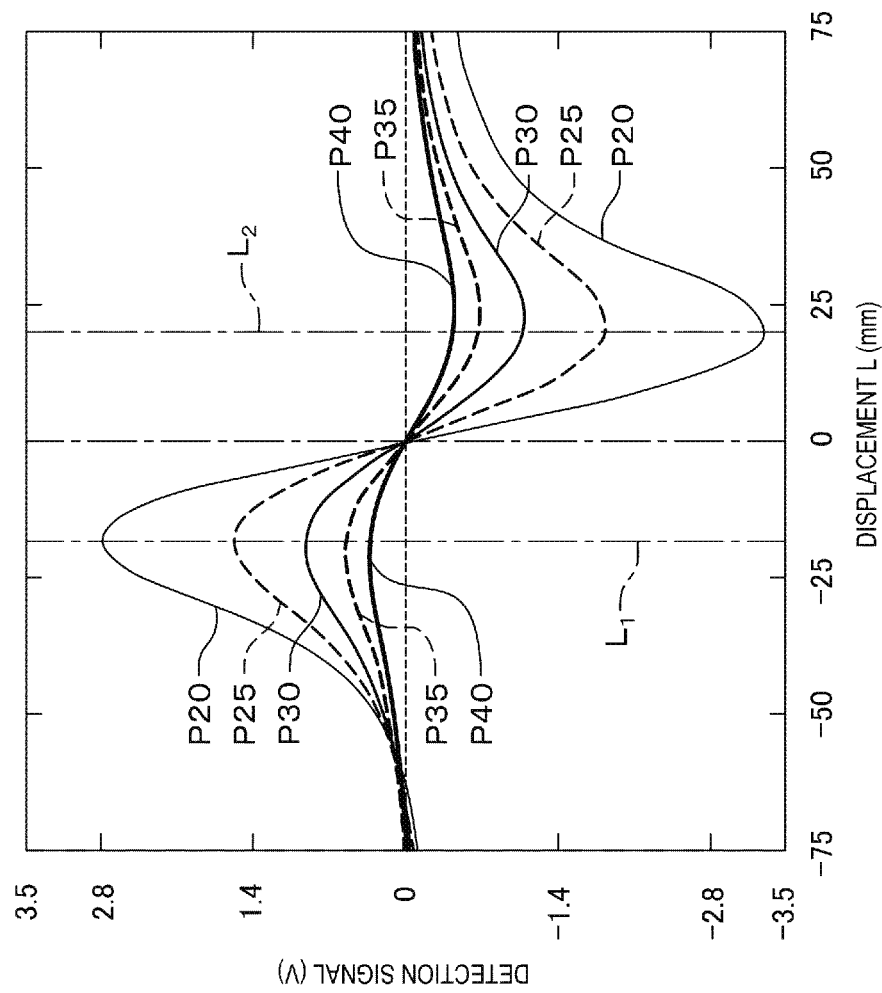
FIG. 3 is a diagram illustrating a level characteristic of a detection signal output from the receiver coil.

Next, FIG. 3 illustrates levels of the detection signals output from the receiver coil 6 in accordance with various sensor gaps d. In FIG. 3, the horizontal axis represents the displacement L, and the vertical axis represents the level of the detection signal. Further, when the phase of the AC voltage applied to the oscillation coils 5A and 5B and the phase of the detection signal are matched, the value of the detection signal is set to be positive. When the both phases are reverse, the value of the detection signal is set to be negative. Further, characteristics P20, P25, P30, P35, and P40 in the drawing are characteristics when these sensor gaps d are 20 mm, 25 mm, 30 mm, 35 mm, and 40 mm.

These characteristics P20 to P40 all are maximized at a displacement $L_1$ (first displacement), and minimized at a displacement $L_2$ (second displacement). Considering the amplitude of the induced voltage, it means that a first maximum value appears at the displacement $L_1$, and a second maximum value of which the phase is reversed against the first maximum value appears at the displacement $L_2$. In addition, characteristics P20 to P40 are almost linear near the displacement L=0, and the displacement L is almost proportional to the detection signal.

Circuit Configuration of First Embodiment

Figure 4:
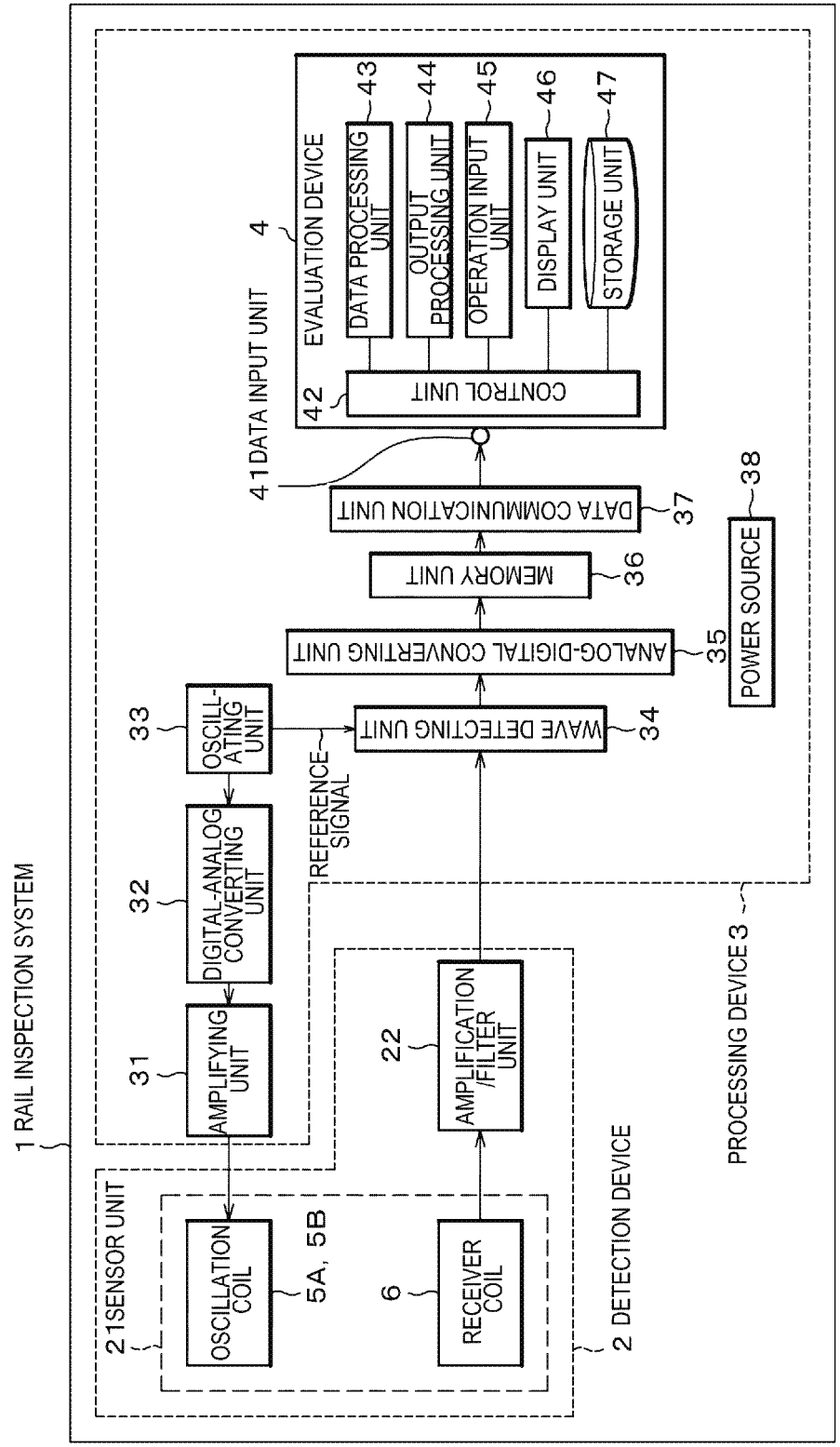
FIG. 4 is a block diagram illustrating an entire configuration of the rail inspection system according to the first embodiment.

FIG. 4 is a block diagram illustrating an entire configuration of the rail inspection system 1 according to the embodiment.

As described above, the rail inspection system 1 includes the detection device 2 and the processing device 3.

In addition, the detection device 2 includes the sensor unit 21 and the amplification/filter unit 22, and the sensor unit 21 includes the oscillation coils 5A and 5B and the receiver coil 6. In addition, the processing device 3 includes an amplifying unit 31 (AC voltage source), a digital-analog converting unit 32 (AC voltage source), an oscillating unit 33 (AC voltage source), a wave detecting unit 34, an analog-digital converting unit 35, a memory unit 36, a data communication unit 37, a power source 38, and an evaluation device 4 (displacement detection unit).

The oscillating unit 33 outputs a sinusoidal digital oscillation signal of the predetermined oscillation frequency f (for example, 20 kHz). The digital-analog converting unit 32 converts the digital oscillation signal output by the oscillating unit 33 into analog AC voltage. The amplifying unit 31 amplifies the AC voltage and applies the AC voltage to the oscillation coils 5A and 5B. The oscillation coils 5A and 5B generate the reverse magnetic fields of which the phases are reversed.

In addition, the amplification/filter unit 22 in the detection device 2 amplifies and filters the detection signal supplied from the receiver coil 6, and transmits the signal to the wave detecting unit 34 of the processing device 3. Further, the "filtering" is a low-pass filtering (LPF) in which frequency components equal to or more than the oscillation frequency f are mainly removed. In addition, the wave detecting unit 34 performs a full-wave rectification on the detection signal supplied from the amplification/filter unit 22 using a reference signal from the oscillating unit 33, and supplies the signal to the analog-digital converting unit 35. The analog-digital converting unit 35 converts the analog signal received from the wave detecting unit 34 into a digital signal. The digital signal output from the analog-digital converting unit 35 is stored in the memory unit 36 as data, and output from the data communication unit 37 to the evaluation device 4. The power source 38 supplies power to the respective configurations in the rail inspection system 1.

Next, the evaluation device 4 will be described. The evaluation device 4 is a computer device which executes an inspection process program to specify the positional deviation of the railroad rail 100 based on the inspection data which is received from the detection device 2 or the components 31 to 38. Further, the "inspection data" in the embodiment is assumed to correspond to data of all stages from the receiver coil of the detection device 2 to a data input unit 41 of the evaluation device 4. The evaluation device 4 includes the data input unit 41, a control unit 42, a data processing unit 43, an output processing unit 44, an operation input unit 45, a display unit 46, and a storage unit 47.

The data input unit 41 receives the output signal (inspection data) of the data communication unit 37.

The control unit 42 includes a central processing unit (CPU), a random access memory (RAM), and a read only memory (ROM), and controls process such as data transfer and calculation. The data processing unit 43 performs inspection based on the output signal (inspection data) (to be described in detail later). Information such as the inspection result is appropriately stored in the storage unit 47.

The display unit 46 is a liquid crystal display (LCD), a cathode ray tube (CRT) display, or the like, for displaying the inspection result. The output processing unit 44 causes the display unit 46 to display the inspection result. At that time, the output processing unit 44 performs a process of displaying the result in a format easy to visually understand using an appropriate graph or table format. The operation input unit 45 is an information input unit such as a keyboard and a mouse. The storage unit 47 stores data processed by the data processing unit 43. Further, the data processing unit 43 and the output processing unit 44 are realized by loading a program and data stored in the storage unit 47 to the control unit 42 and performing the calculation process.

Operation of First Embodiment

Figure 5:
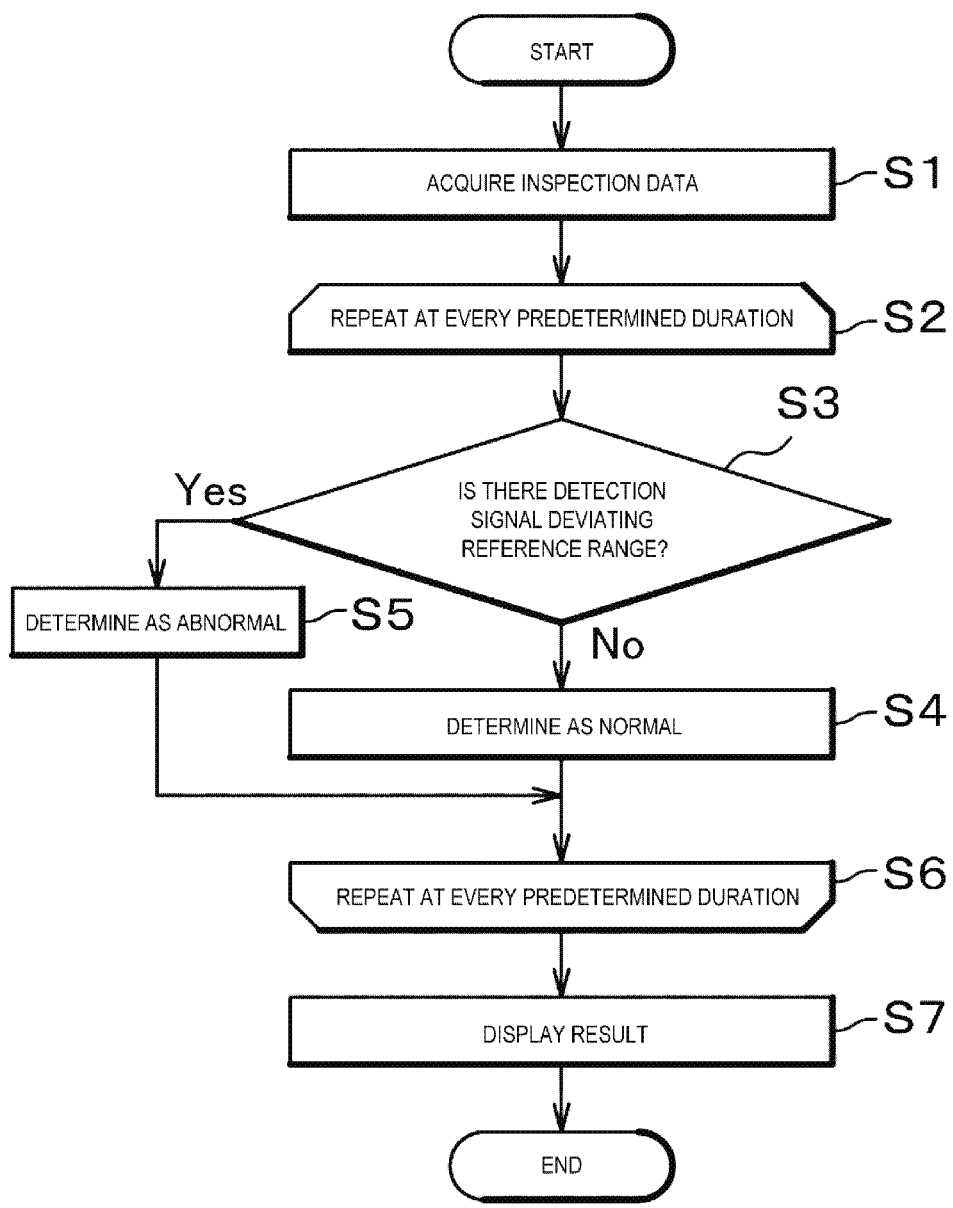
FIG. 5 is a flowchart of an inspection process program in the first embodiment.

FIG. 5 is a flowchart of the inspection process program which is executed by the data processing unit 43 of the evaluation device 4.

First, the data processing unit 43 acquires the inspection data from the storage unit 47 (step S1).

Next, the data processing unit 43 repeatedly performs the following steps S3 to S5 for every predetermined duration (for example, about 0.5 ms to 100 ms) (step S2 to S6).

The data processing unit 43 performs determination on the inspection data of a predetermined duration whether there is a detection signal deviated from a reference range (step S3). When there is no deviated signal, it is determined as normal (step S4). When there is a deviated signal, it is determined as abnormal (step S5).

When the processes of step S2 to S6 are performed on all the inspection data, the data processing unit 43 displays an inspection result in the display unit 46 (step S7).

As described above, according to the rail inspection system (1) of the embodiment, when the displacement (L) is the first displacement ($L_1$), the first maximum value appears in the induced voltage. When the displacement (L) is the second displacement ($L_2$), the second maximum value of which the phase is reversed against the first maximum value appears in the induced voltage. Therefore, the displacement (L), that is, the positional deviation of the rail, can be detected with accuracy.

In addition, the attaching tool (25) is provided to attach the chassis (20) to the bottom surface of the vehicle such that the chassis (20) for storing the first sensor unit (21) and the first sensor unit (21) are disposed at predetermined positions of the bottom surface of the vehicle, so that the first sensor unit (21) can be mounted at an accurate position.

In addition, the AC voltage source (31, 32, 33) applies the AC voltage to generate a reverse magnetic field with respect to the first oscillation coil (5A) and the second oscillation coil (5B). Therefore, the induced voltage generated in the receiver coil (6) can be set to almost zero at the reference position.

Second Embodiment

Next, a rail inspection system according to a second embodiment of the invention will be described.

Figure 6:
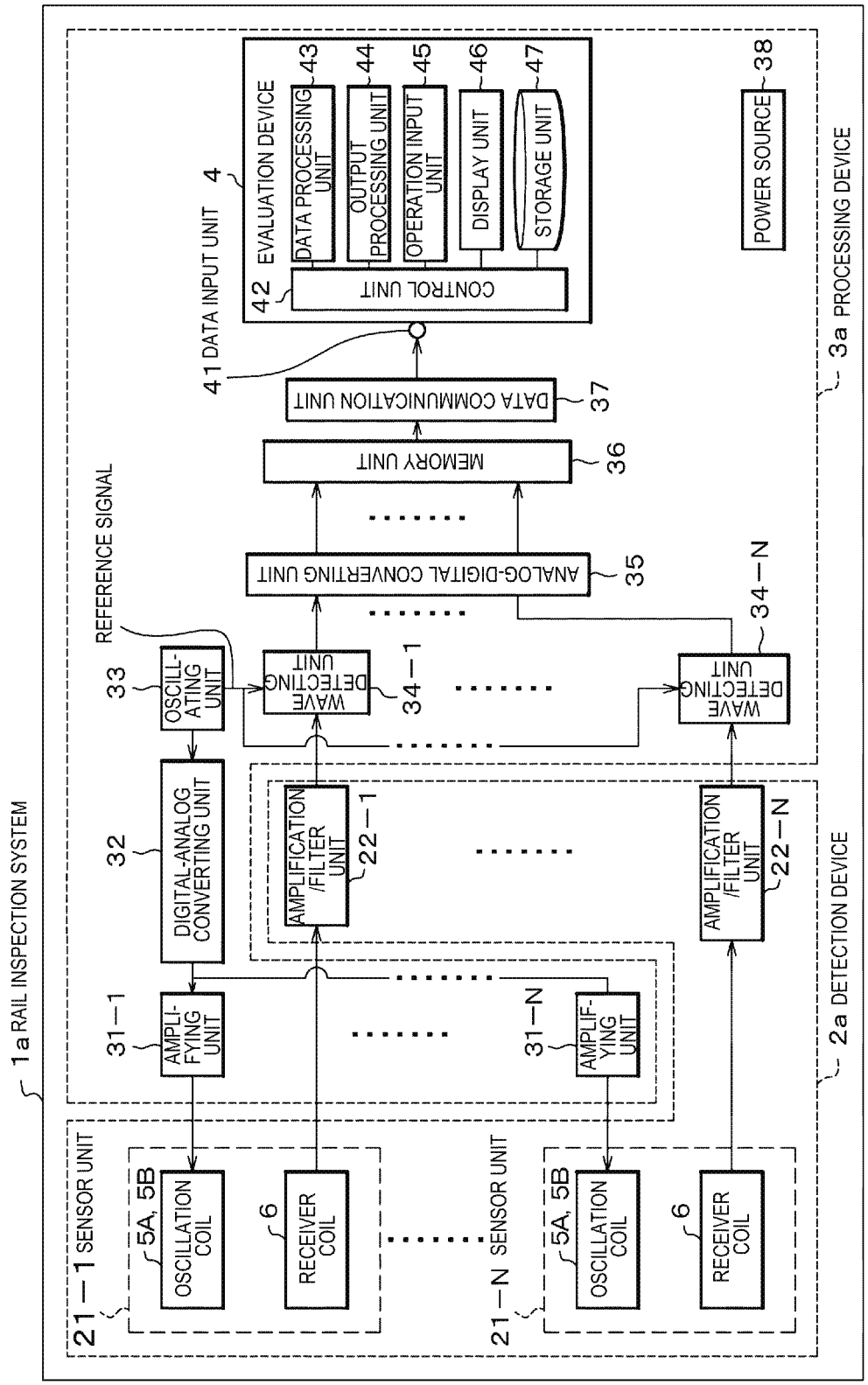
FIG. 6 is a block diagram illustrating an entire configuration of a rail inspection system according to a second embodiment.
Figure 7:
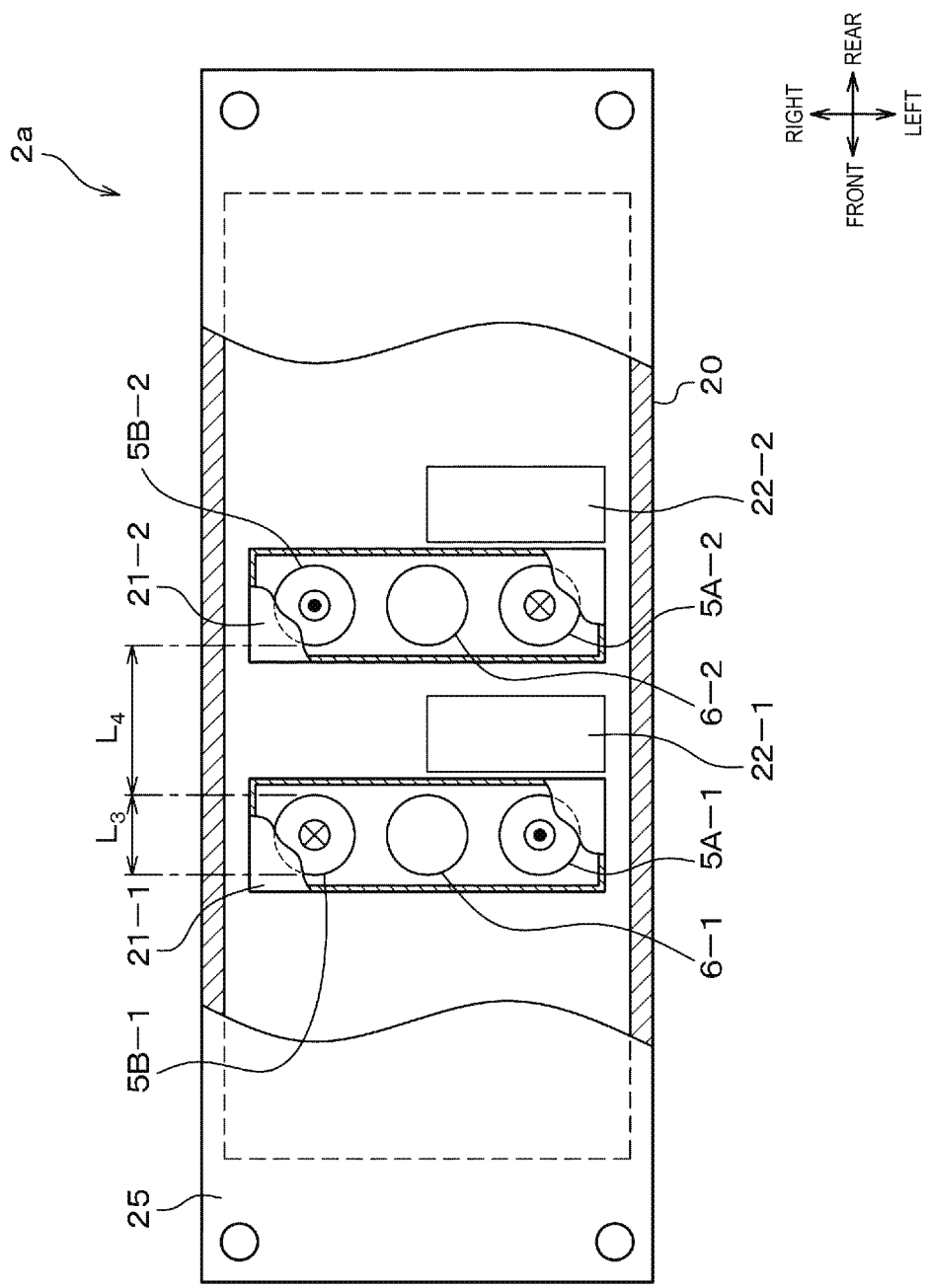
FIG. 7 is a top view partially broken away illustrating a detection device in the second embodiment.

FIG. 6 is a block diagram illustrating an entire configuration of a rail inspection system 1a according to the embodiment. In addition, FIG. 7 is a top view partially broken away illustrating a detection device 2a according to the embodiment. Further, in FIGS. 6 and 7, the portions corresponding to the respective portions of FIGS. 1 to 5 will have the same symbol, and the description thereof may be omitted.

In FIG. 6, the rail inspection system 1a includes a processing device 3a and a plurality of detection devices 2a, and is mounted in the inspection vehicle (not illustrated) similarly to the first embodiment. However, in FIG. 6, the inner configuration of the plurality of detection devices 2a are surrounded by one frame. Each detection device 2a has an outer appearance similar to that of the detection device 2 of the first embodiment (see FIG. 1). The plurality of detection devices 2a include sensor units 21-1 to 21-N of N channels (N is a plural number). Each of the sensor units 21-1 to 21-N is configured similarly to the sensor unit 21 of the first embodiment (see FIG. 4).

As illustrated in FIG. 7, in one detection device 2a, the sensor units 21-1 (first sensor unit) and 21-2 (second sensor unit) of two channels are disposed along the front and rear direction. Therefore, if two detection devices 2a are mounted in the inspection vehicle, the number (N) of channels becomes "4". The sensor units 21-1 and 21-2 include receiver coils 6-1 (first receiver coil) and 6-2 (second receiver coil) disposed at each center in the left and right direction, oscillation coils 5A-1 (first oscillation coil) and 5A-2 (third oscillation coil) disposed on left sides thereof, and oscillation coils 5B-1 (second oscillation coil) and 5B-2 (fourth oscillation coil) disposed on right sides of the receiver coils 6-1 and 6-2.

In addition, a gap $L_4$ between the coils (for example, the oscillation coils 5B-1 and 5B-2) which are adjacent in the front and rear direction is set to be larger than a diameter $L_3$ of each coil. The reason is to prevent crosstalk between the sensor units 21-1 and 21-2. In FIG. 7, the oscillation coils 5A-1 and 5B-2 which face obliquely generate the same phase of magnetic field. The oscillation coils 5A-2 and 5B-1 generate a reverse magnetic field of which the phase is reversed against that of the oscillation coils 5A-1 and 5B-2. For example, as illustrated in the drawing, the oscillation coils 5A-2 and 5B-1 generate a downward magnetic field at timing when the oscillation coils 5A-1 and 5B-2 generate an upward magnetic field. The detection signal output from the receiver coils 6-1 and 6-2 becomes ideally a signal which has the same amplitude and the reverse phase.

Returning to FIG. 6, N amplifying units 31-1 to 31-N (AC voltage source) provided in the processing device 3a, amplify the analog AC voltage output from the digital-analog converting unit 32, and apply the AC voltage to the oscillation coils 5A and 5B of the corresponding sensor units 21-1 to 21-N. In addition, N amplification/filter units 22-1 to 22-N amplify and filter the detection signal supplied from the corresponding receiver coil 6, and then transmit the signal to corresponding wave detecting units 34-1 to 34-N in the processing device 3a.

In addition, the wave detecting units 34-1 to 34-N perform the full-wave rectification on the detection signal of N channels supplied from the amplification/filter units 22-1 to 22-N using the reference signal from the oscillating unit 33, and supply the signal to the analog-digital converting unit 35. The analog-digital converting unit 35 converts the analog signals of N channels into digital signals. The digital signal output from the analog-digital converting unit 35 is stored in the memory unit 36 as data, and output from the data communication unit 37 to the evaluation device 4.

The configuration of the evaluation device 4 is also similar to that of the first embodiment (see FIG. 4), but the operation of the data processing unit 43 in the embodiment is slightly different from that of the first embodiment. In other words, the data processing unit 43 of the embodiment obtains a difference between the detection signals (for example, the detection signals output from the receiver coils 6-1 and 6-2 in FIG. 7) output from the same detection device 2a, and determines whether there is an abnormality considering the calculation result as the detection signal in the detection device 2a (step S3 of FIG. 5).

As described above, according to the embodiment, the amplitude of the detection signal can be made about two times the amplitude of the detection signal in the first embodiment, and an S/N ratio can be made higher than that of the first embodiment. Therefore, it is possible to determine whether there is an abnormality with further accuracy. In addition, assume a case that a noise source is near the detection device 2a, and the magnetic flux generated by the noise source is interlinked to the receiver coils 6-1 and 6-2. In this case, the magnetic fluxes interlinked to the receiver coils 6-1 and 6-2 become almost the same level and the same phase. Therefore, if a difference of the detection signals of both magnetic fields is obtained, the noise component contained in the detection signals can be removed. In this way, the rail inspection system 1a of the embodiment is advantageous compared to the first embodiment in that the S/N ratio can be made high, and the noise component can be removed.

Third Embodiment

Next, a rail inspection system according to a third embodiment of the invention will be described.

The entire configuration of the rail inspection system of the third embodiment is similar to that of the second embodiment (FIG. 6). However, a detection device 2b illustrated in FIG. 8 is applied to the embodiment instead of the detection device 2a of the second embodiment. Further, FIG. 8 is a side view partially broken away illustrating the detection device 2b. The portions corresponding to those of FIGS. 1 to 7 will have the same symbols, and the description thereof may be omitted.

In FIG. 8, the detection device 2b includes the chassis 20 and the flange 25, which are similar to those of the detection device 2 of the first embodiment (see FIG. 1).

In the detection device 2b of the embodiment, the sensor units 21-1 to 21-3 of three channels are disposed along the front and rear direction. These sensor units 21-1 to 21-3 are each configured similarly to the sensor unit 21 of the first embodiment. However, the sensor units 21-1, 21-2, and 21-3 are attached to different positions in the chassis 20 such that sensor gaps $d_1$, $d_2$, and $d_3$ (distance) become different with respect to the railroad rail 100.

Further, the reason for such a configuration will be described with reference to FIG. 3. As illustrated in FIG. 3, characteristics P20 to P40 of the detection signal are different according to the sensor gap d. Therefore, if the sensor gap d is unknown even though the value of the detection signal is detected, the displacement L is not possible to be specified. In addition, in FIG. 3, the detection signal is less changed with respect to the change of the displacement L as the sensor gap d is increased.

In FIG. 8, the detection device 2b is mounted in the inspection vehicle (not illustrated) such that the sensor gaps $d_1$, $d_2$, and $d_3$ in a stop state each become a predetermined reference value. However, when vertical vibration occurs in the inspection vehicle, the sensor gaps $d_1$, $d_2$, and $d_3$ are deviated from the reference value. In the embodiment, the sensor units 21-1 to 21-3 of three channels output the detection signals. Then, the data processing unit 43 (see FIG. 6) calculates estimated values of the sensor gaps $d_1$, $d_2$, and $d_3$ based on the phenomenon "the detection signal is less changed with respect to the change of the displacement L as the sensor gap d is increased", and calculates the displacement L (see FIG. 2B) based on the phenomenon and the detection signals of three channels.

As described above, according to the embodiment, the displacement L is calculated while compensating variations of the sensor gaps $d_1$, $d_2$, and $d_3$ based on the vibration. Therefore, the variation of the detection signal caused by the vertical vibration of the detection device 2b can be compensated, so that the displacement L can be measured with still more accuracy.

[Modifications]

The invention is not limited to the above embodiments, and various modifications can be made. The embodiments are given as examples to describe the invention in a clearly understandable way, and thus the invention is not necessarily limited to provide all the configurations described above. In addition, some configurations of a certain embodiment may be replaced with the configurations of another embodiment, and the configuration of another embodiment may also be added to the configuration of a certain embodiment. Furthermore, omission of some configurations of each embodiment, or additions and substitutions may be made using other configurations. For example, possible modifications of the embodiments are as follows.

(1) In the respective embodiment, the oscillation frequency f of the oscillating unit 33 has been described as 20 kHz, but a frequency other than 20 kHz may be selected as the oscillation frequency f. However, the oscillation frequency f is desirably selected from a frequency range of 10 Hz to 100 GHz. This is because, if the frequency f is lower than 10 Hz, the sensitivity of the receiver coil 6 becomes bad, and if exceeding 100 GHz, the impedances of the oscillation coils 5A and 5B are increased, and thus the magnetic field weakens. In addition, the frequency f is more desirable to be selected from a range of 1 kHz to 1 GHz, and still more desirable to be selected from a range of 10 kHz to 100 kHz.

(2) In the respective embodiment, the oscillation coil and the receiver coil are arranged in a direction (left and right direction) perpendicular to the layout direction (front and rear direction) of the railroad rail 100. However, the arrangement direction of the oscillation coil and the receiver coil is not necessary to be the direction perpendicular to the layout direction (front and rear direction) of the railroad rail 100, but may be an intersecting direction (for example, an obliquely intersecting direction).

(3) In the third embodiment, the sensor units 21-1 to 21-3 of three channels having different sensor gaps $d_1$, $d_2$, and $d_3$ have been applied. However, the sensor unit is not necessarily provided as three channels. If the sensor units 21-1 and 21-2 of two channels having different sensor gaps $d_1$ and $d_2$ are provided, the variation of the sensor gaps $d_1$ and $d_2$ caused by the vertical vibrations can be compensated.

Figure 9A:
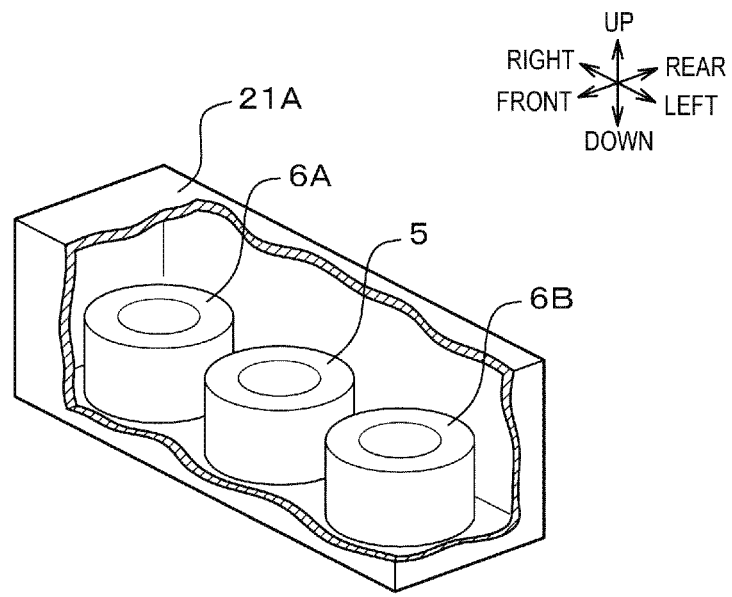
FIG. 9A is a perspective view partially broken away illustrating a sensor unit in a modification.

(4) In the respective embodiments, each of the sensor units 21, and 21-1 to 21-N includes two oscillation coils and one receiver coil. However, the sensor units may be configured as a sensor unit 21A illustrated in FIG. 9A. The sensor unit 21A includes one oscillation coil 5 and two receiver coils 6A and 6B which are provided on the left and right sides of the oscillator coil. In this case, a subtraction result of the induced voltages of the receiver coils 6A and 6B may be used as the detection signal.

Figure 9B:
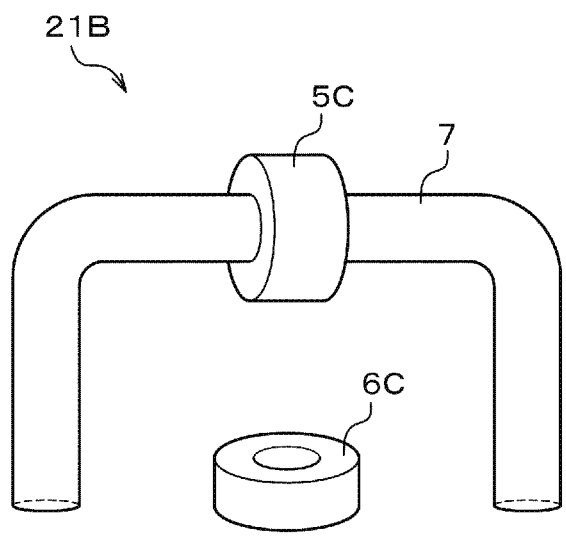
FIG. 9B is a perspective view of a sensor unit in another modification.

(5) In addition, the sensor units 21, and 21-1 to 21-N may be configured as a sensor unit 21B illustrated in FIG. 9B. The sensor unit 21B includes an iron core 7 which is formed in an approximate C shape, an oscillation coil 5C which is wound around the iron core 7, and a receiver coil 6C which is disposed in the middle of both ends of the iron core 7. Since the reverse magnetic fields are generated from both ends of the iron core 7, the displacement of the railroad rail 100 can be measured by the induced voltage of the receiver coil 6C similarly to the respective embodiments.

(6) The hardware of the evaluation device 4 in the embodiment may be realized by a general purpose computer. Therefore, a program related to the flowchart illustrated in FIG. 5 and the like may be stored in a recording medium, and may be distributed through a transmission path.

(7) The process illustrated in FIG. 5 has been described as a software process using a program. Part or all of the process may be replaced with a hardware process using an application specific integrated circuit (ASIC) or a field-programmable gate array (FPGA).

What is claimed is:
1. A rail inspection system, comprising:
a first sensor unit which is disposed to face a rail for a vehicle, and includes at least one receiver coil and at least one oscillation coil which are arranged in an arrangement direction intersecting with a layout direction of the rail;
an AC voltage source which applies an AC voltage to the oscillation coil;
a displacement detection unit which detects a displacement between the rail and the first sensor unit based on an induced voltage of the receiver coil, wherein
the first sensor unit is configured such that, when the displacement is a first displacement, a first maximum value appears in the induced voltage, and when the displacement is a second displacement, a second maximum value of which a phase is reversed against the first maximum value appears in the induced voltage wherein
the first sensor unit includes a first oscillation coil, a first receiver coil, and a second oscillation coil which are arranged along the arrangement direction, and
the AC voltage source applies the AC voltage to the first oscillation coil and the second oscillation coil such that a reverse magnetic field is generated.

2. The rail inspection system according to claim 1, further comprising:
a second sensor unit which is disposed to face the first sensor unit along the layout direction, wherein
the second sensor unit includes a third oscillation coil which faces the first oscillation coil along the layout direction, a second receiver coil which faces the first receiver coil along the layout direction, and a fourth oscillation coil which faces the second oscillation coil along the layout direction, and
the AC voltage source applies the AC voltage to the third oscillation coil and the fourth oscillation coil to cause the third oscillation coil to generate a magnetic field of the same direction as the second oscillation coil, and to cause the fourth oscillation coil to generate a magnetic field of the same direction as the first oscillation coil.

3. The rail inspection system according to claim 2, wherein
a gap between the first oscillation coil and the third oscillation coil is larger than a diameter of the first oscillation coil.

4. The rail inspection system according to claim 1, further comprising:
a second sensor unit which is disposed to face the rail, and includes at least one receiver coil and at least one oscillation coil which are arranged in an arrangement direction intersecting with the layout direction, wherein
a distance between the second sensor unit and the rail is longer than a distance between the first sensor unit and the rail.

* * * * *